United States Patent [19]

Ransom et al.

[11] 4,404,480
[45] Sep. 13, 1983

[54] HIGH SPEED-LOW POWER GALLIUM ARSENIDE BASIC LOGIC CIRCUIT

[75] Inventors: Stephen A. Ransom, Huntingdon Valley; Tedd K. Stickel, Chalfont, both of Pa.

[73] Assignee: Sperry Corporation, New York, N.Y.

[21] Appl. No.: 344,585

[22] Filed: Feb. 1, 1982

[51] Int. Cl.³ .................. H03K 19/094; H03K 19/017; H03K 19/20

[52] U.S. Cl. .................. 307/475; 307/304; 307/450; 307/457

[58] Field of Search .............. 307/475, 446, 450, 457, 307/458, 570, 581, 304, 467, 455, 264; 357/22

[56] References Cited

U.S. PATENT DOCUMENTS 3,299,363  1/1967  Slattery et al. .................. 308/457 X
4,300,064  11/1981  Eden .............................. 307/458 X

OTHER PUBLICATIONS

Van Tuyl and Liechti, "High-Speed GaAs MSI", IEEE Int'l Solid-State Circuits Conf., Session 1, Feb. 18, 1976.
Zuleeg et al., "Femtojoule High-Speed Planar GaAs E-JFET Logic", *IEEE Transactions on Electron Devices*, vol. ED-25, No. 6, Jun. 1978, pp. 628-639.
Van Tuyl and Liechti, "GaAs MESFET Logic with 4-GHz Clock Rate", *IEEE Journal of Solid-State Circuits*, vol. SC-12, No. 5, Oct. 1977, pp. 485-496.

*Primary Examiner*—Stanley D. Miller
*Assistant Examiner*—David R. Hudspeth
*Attorney, Agent, or Firm*—John B. Sowell; Thomas J. Scott; Marshall M. Truex

[57] ABSTRACT

The present invention provides a high-speed low-power gallium arsenide basic logic circuit which is capable of being driven by either emitter coupled logic or gallium arsenide logic level signals to provide combinational logic gating such as OR-AND, OR-NAND, OR-AND-OR and OR-AND-NOR capable of driving directly either emitter coupled logic or gallium arsenide logic circuits. The combinational logic gating is basically accomplished by diode logic which performs other functions and which requires less area on an integrated circuit chip than active switching transistors.

10 Claims, 9 Drawing Figures

HIGH SPEED-LOW POWER GALLIUM ARSENIDE BASIC LOGIC CIRCUIT

This invention is related to our Application Ser. No. 264,898 filed May 18, 1981 for a High-Gain Stabilized Converter and to our Application Ser. No. 305,320 filed Sept. 24, 1981 for a Gallium Arsenide to Emitter Coupled Logic Level Converter.

BACKGROUND OF THE INVENTION

1. Field of the Invention

This invention relates to gallium arsenide (GaAs) high density logic circuitry. More particularly, this invention relates to GaAs circuitry which can be implemented in the form of a novel high density integrated circuit to provide combinational gating with improved speed power product.

2. Description of the Prior Art

In addition to the above-mentioned related cases which show differential amplifiers employed to drive one family of logic from another family or logic, simple GaAs gate structures are known which will perform such functions as AND, NAND, OR, NOR and EXCLUSIVE OR functions.

Numerous different types of transistor logic are commercially available in the form of integrated circuits.

Manufacturers of semiconductor devices often produce a complete series of such integrated circuits which are referred to as families of devices and which are completely compatible with each other. Such families of integrated circuits will accept the input from a similar family of logic and will produce an output signal which is capable of driving a similar family of logic.

It is not uncommon for logic designers of equipment, such as high speed computers, to adapt in the same computer more than one family of semiconductor devices. When the input voltage levels and output voltage levels of signals from the different families of devices are not matched, they are referred to as being incompatible and require some form of signal conversion to assure that the logic signals are properly sensed and processed. Typically, the power supply levels may be different, the logic voltage swings may be different or the signals may require reshaping, amplification and/or attenuation for producing proper threshold voltage levels.

The above problems are understood by those skilled in the art. Commercially available translators and converters are sold by semiconductor manufacturers to interface incompatible logic signals between some of the different families of integrated circuit devices. The two above-mentioned related applications serve the purpose of interfacing emitter coupled logic (ECL) voltage levels with GaAs logic voltage levels and also interface GaAs logic voltage levels with ECL logic voltage levels.

It would be desirable to provide a high speed-low power, high density GaAs basic logic circuit adapted for implementation as an integrated circuit and to provide therewith all of the necessary translation and conversion on the same circuit without the requirement of additional logic components which would slow down the logic signals being processed as well as take up additional area on the integrated circuit.

It would also be extremely desirable if the translation or conversion of the logic signals was performed in the logic circuitry without the requirement for additional conversion circuitry on the GaAs integrated circuit chip. It would be desirable that the translation or conversion of the logic signals be performed simultaneously with the performance of the gating logic of the basic logic circuit so as to speed up the time required for processing such signals. It would be desirable that the GaAs logic circuitry be implemented in a form which is faster and requires less power than conventional circuits.

SUMMARY OF THE INVENTION

It is a principal object of the present invention to provide a novel basic logic circuit for implementation as a GaAs integrated circuit.

It is yet another object of the present invention to provide a GaAs logic circuit which will produce signals for driving either GaAs or ECL logic.

It is another object of the present invention to provide a novel GaAs basic logic circuit which is capable of being driven by either ECL or GaAs logic level inputs.

It is yet another object of the present invention to provide a new GaAs basic logic circuit capable of accepting a very large number of logic input signals.

It is yet another object of the present invention to provide a new GaAs basic logic circuit which is capable of driving a large number of similar logic circuits.

It is yet another object of the present invention to provide a new GaAs basic logic circuit implemented with GaAs diodes which reduce the power requirements and enhance the speed of operation.

It is yet another object of the present invention to provide a novel GaAs basic logic circuit which may be altered or modified so that several different logic functions may be implemented on the same integrated circuit chip to provide a complete family of high speed logic circuitry in high-density form.

According to these and other objects of the present invention there is provided a high-speed GaAs basic logic circuit comprising a plurality of GaAs OR gates connected to a similar plurality of level shifting networks, said level shifting network providing an AND gate wherein the output of the AND gate is connected with a suitable amplifier so that either emitter coupled logic or gallium arsenide logic input signals are adapted to drive either gallium arsenide or emitter coupled logic circuits.

DESCRIPTION OF THE PREFERRED EMBODIMENTS

Figure 1:
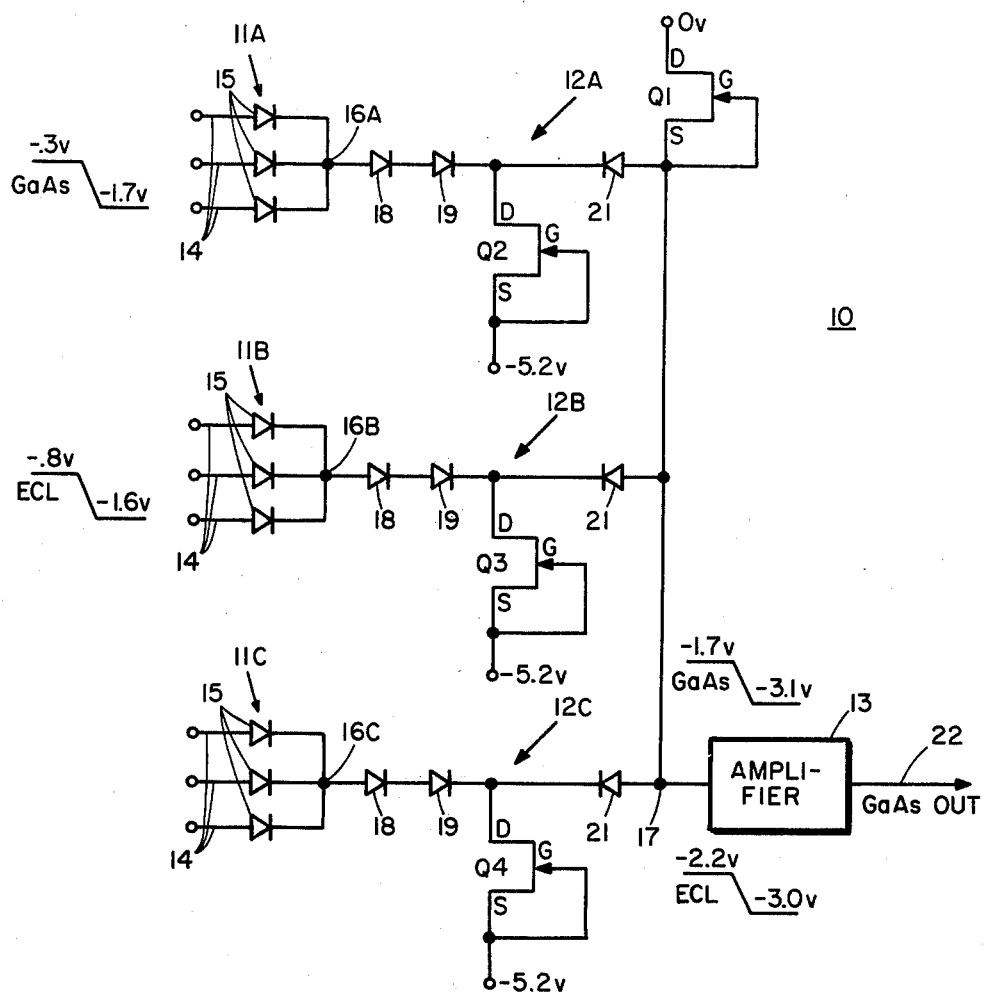
FIG. 1 is a schematic diagram of an electrical circuit showing combined OR-AND logic.

Refer now to FIG. 1 showing a simplified schematic diagram electrical circuit 10. The circuit 10 comprises a plurality of OR gates 11A, 11B, 11C, connected to a plurality of level shifting networks 12A, 12B and 12C respectively. As will be explained hereinafter, the plurality of level shifting networks together also comprise an AND gate whose output is adapted to be connected to an amplifier 13 for processing the output of the basic logic circuit 10.

Input lines 14 of the OR gates 11A, 11B and 11C are each provided with a forward bias diode 15. The diodes 15 of the individual OR gates are connected together at their cathode to form an output node 16A, 16B and 16C respectively. Intermediate the output nodes 16A, 16B and 16C and the input node 17 to the amplifier 13 there is provided a level shifting network 12A, 12B and 12C. Each of the level shifting networks 12 comprise a pair of forward bias level shifting diodes which shift the voltage level from the input lines 14 down. Each of the level shifting networks 12 also include a diode 21 which has the anode of the diode connected to the input node to the amplifier 17. Also connected to the anode side of the diodes 21 is a pull-up transistor Q1 having its source and gate connected to the node 17. On the cathode side of diodes 21, each of the level shifting networks 12A, 12B and 12C have a pull-down transistor connected to the cathode of diode 21. These pull-down transistors Q2, Q3 and Q4 respectively have their drains connected to the cathode side of diode 21 so that current can flow through transistor Q1 through diodes 21 and through the transistors Q2, Q3 and Q4 to the negative supply shown as minus 5.2 volts. In order for the AND gate function to be performed, the transistors Q2, Q3 and Q4 must be capable of sinking all of the current which can be supplied by the transistor Q1 so that the input node 17 can be pulled to a low voltage when all of the inputs to one of the OR gates 11 is in a low voltage condition. Opposite OR gate 11A there is shown a typical GaAs voltage level swing which has a logical one at minus 0.3 volts and a logical zero or minus 1.7 volts. Thus, when all three input lines 14 of OR gate 11A are at the minus 1.7 volt condition, then input node 17 will go to a low condition which is minus 3.1 volts. When the high condition of minus 0.3 volts appears at each of the OR gates 11A, 11B, 11C, then minus 2.4 volts will appear at the drains of transistors Q2, Q3 and Q4. This condition will cause the shifted output from the input node 17 to be clamped at minus 1.7 volts due to the voltage up-shift across diode 21 of plus 0.7 volts. Shown opposite amplifier 13 are the voltage swings which appear at the input node 17 when GaAs inputs are applied to input lines 14. This voltage swing shows that the logic high is minus 1.7 volts and the logic low or zero is 3.1 volts for GaAs. When the GaAs voltage swings at input node 17 are applied to a simple GaAs amplifier 13, the output signal on line 22 has the proper voltage levels for driving GaAs logic.

Opposite OR gate 11B there is shown the voltage level swing for emitter coupled logic (ECL). The high or logic one condition is at minus 0.8 volts and the low or logic zero condition is at minus 1.6 volts. When this voltage swing is transmitted via diodes 15, 18, 19 and 21 to input node 17, there is a voltage shift down three diodes combined with a voltage shift up of one diode at diode 21 which results in a net voltage swing down of two diodes or minus 1.4 volts. This results in an input voltage swing of minus 2.2 volts for a logic high and a minus 3.0 volts logic low, as shown below amplifier 13 which is the correct voltage swing for driving a differential amplifier 13 and producing voltage swing outputs on output line 22 capable of driving GaAs logic.

Figure 2:
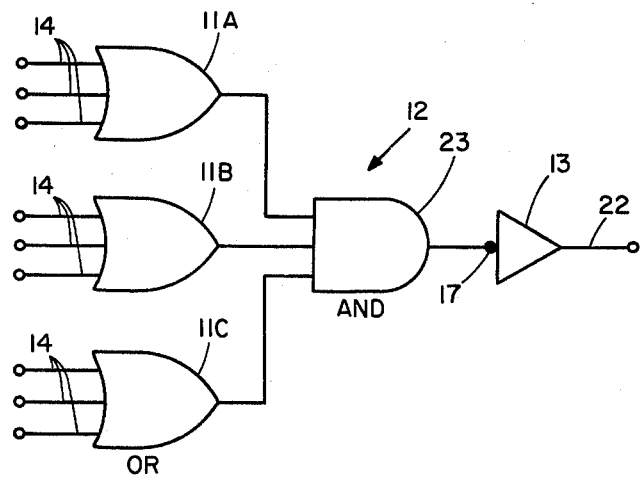
FIG. 2 is a logic diagram of the electrical circuit of FIG. 1.

Refer now to FIG. 2 showing a logic diagram of the electrical circuitry of FIG. 1. The input lines 14 of each of the OR gates 11A, 11B and 11C produce signals which are applied to the level shifting network 12, which includes the AND gate 23, to produce the output signal from AND gate 23 at the input node 17 to an amplifier 13 to produce an amplified output on line 22. It will be appreciated that amplifier 13 can be an inverting amplifier so that the logic diagram showing OR-AND logic can produce OR-NAND logic at output line 22.

Figure 3:
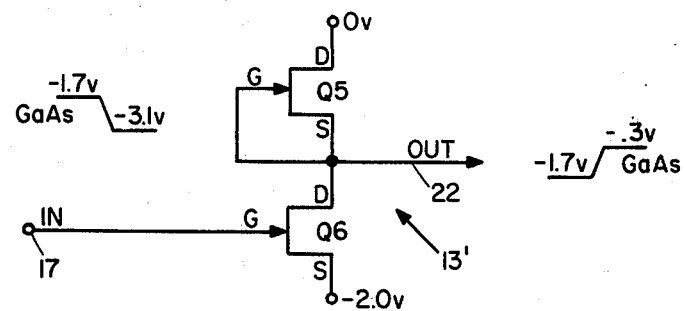
FIG. 3 is a schematic diagram of an electrical circuit showing a transistorized common source amplifier.

FIG. 3 shows a prior art type transistorized amplifier 13' referred to as a common source amplifier. The load transistor Q5 need not be a transistor but may be replaced with a resistor. The transistor Q6 is the active transistor for receiving the signal input at input node 17 which is applied to the gate of transistor Q6 to cause the drain of transistor Q6 to go high or low depending on the input signal at input node 17. As explained hereinbefore, the logic one voltage level required to drive a GaAs amplifier is minus 1.7 volts. When this high logic signal is applied to the gate of transistor Q6, the output line or drain of transistor Q6 goes low producing a minus 1.7 volt output on line 22. When the logic low voltage of minus 3.1 volts is applied to the input node 17, the transistor Q6 inverts this input and produces a logic high of minus 0.3 volts on output line 22.

Figure 4:
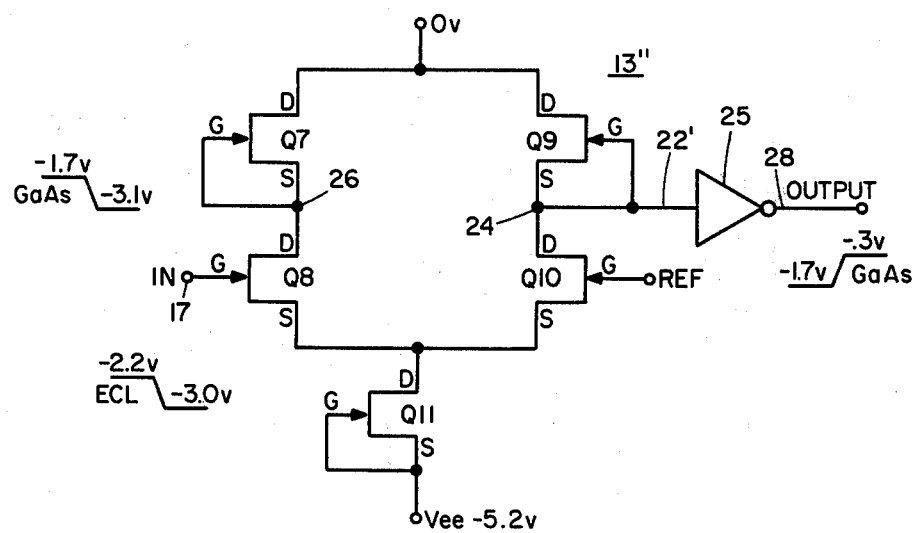
FIG. 4 is a schematic diagram of an electrical circuit showing a transistorized differential amplifier for use with the afore-mentioned OR-AND logic.

Refer now to FIG. 4 which is similar in form to the differential amplifier of the type shown and described in our application Ser. No. 264,898 filed May 18. 1981. The purpose of this amplifier is to permit the afore-mentioned voltage swings, described with FIG. 1, of minus 0.8 volts to minus 1.6 volts which occur with ECL logic to be applied to the input lines 14 of the OR gates 11 to produce voltage swing outputs capable of driving GaAs circuitry. When the ECL voltage swing is applied to input lines 14, it produces a corresponding voltage swing at input node 17 of minus 2.2 volts to minus 3.0 volts. When this translated voltage swing is applied to the input node 17, it is also applied to the gate of input transistor Q8 to cause a non-inverting output at the source of output transistor Q9. Thus, the differential amplifier 13" takes the small translated ECL voltage swing at node 17 as an input and produces a larger voltage swing and amplified output compatible with GaAs logic circuitry. Further, it will be understood that the larger GaAs voltage swing input of minus 1.7 volts and minus 3.1 volts can also be applied to the novel differential amplifier 13" at the input node 17 to produce standard GaAs output voltage swings of minus 0.3 volts and minus 1.7 volts as shown at output line 28. It will be understood that the voltage swings on line 22' are similar to the voltage swings hereinbefore described with respect to output line 22. These same voltage swings may be produced in a different manner. For example, the voltage swings on output line 22' are appearing at output node 24. These voltage swings may be amplified in power amplifier 25 so that a plurality of normal GaAs loads may be powered or driven from the same input signal. It will be understood that differential amplifier 13", provides an inverted amplified signal on output line 28 with respect to input line 17. Amplifier 13" may be made non-inverting by means of connecting line 22' to differential amplifier node 26 instead of node 24. In addition, the physical device size relationship between Q7 and Q9 must be reversed to insure logical function capability that is compensated and stabilized against outside influences such as power supply voltage, temperature, etc.

Transistor Q7 in the input branch of differential amplifier 13" and transistor Q9 in the output branch may be replaced with resistors because their function is a current source load transistor. The transistors Q8 and Q10 are active transistors which translate the input voltage swings to the output voltage swings hereinbefore described when the proper reference voltage is applied to the gate of transistor Q10. The transistor Q11 serves the purpose as a pull-down current source transistor.

Figure 6:
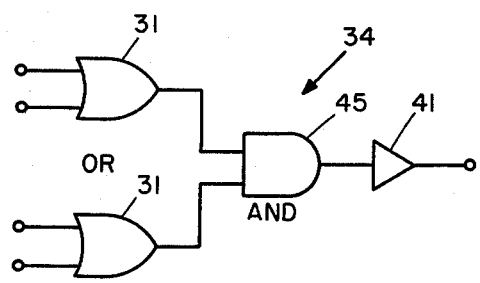
FIG. 6 is a logic diagram of the electrical circuit of FIG. 5.
Figure 5:
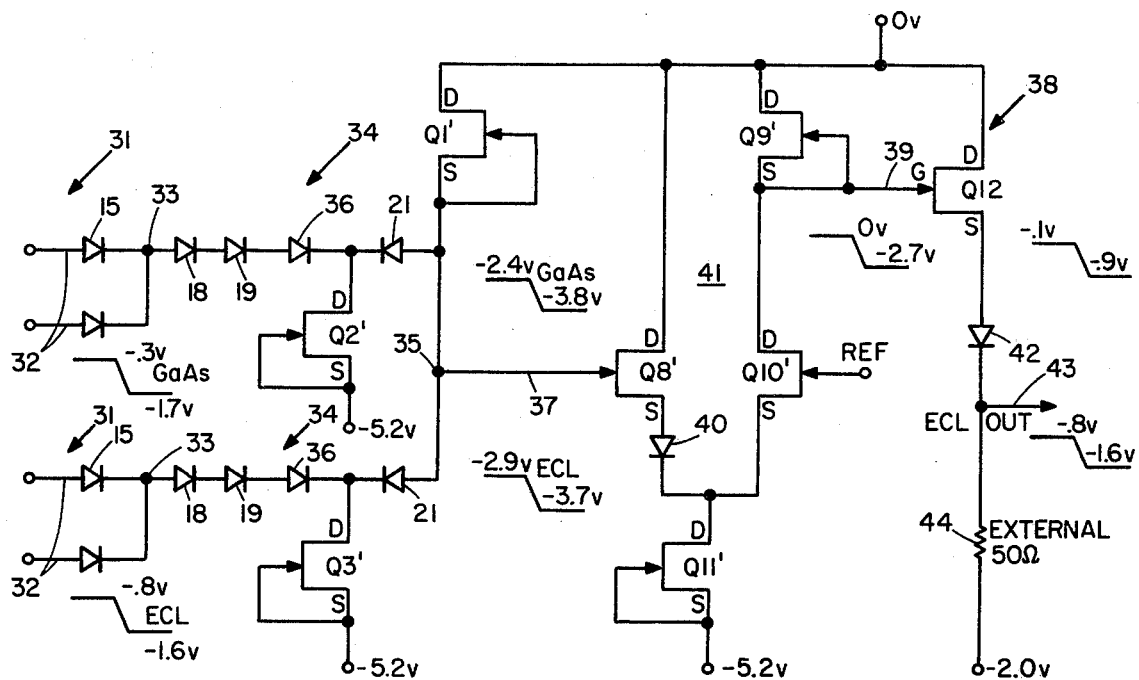
FIG. 5 is a modification of the schematic diagram of FIG. 1 which combines the OR-AND logic with a differential voltage amplifier and a source follower current amplifier.

Refer now to FIGS. 5 and 6 showing a modified form of the FIG. 1 embodiment. As shown in FIG. 6, the logic to be to be performed by the FIG. 5 electrical circuitry is OR-AND logic followed by an amplification stage. FIG. 5 follows the analogy of FIG. 1 wherein the OR gates 31 each comprise a plurality of input lines 32 and output nodes 33. Each level shifting network 34 is intermediately output node 33 of the OR gate and the input node 35 to the amplifier 41. The diodes 15 in the OR gates 31 are identical to those described hereinbefore with respect to FIG. 1. The diodes 18, 19 and 21 are identical to those described hereinbefore with regards to FIG. 1. In order to further shift down the input voltage swings at the OR gates 31, another diode 36 is provided in the level shifting networks 34. When a GaAs voltage swing of minus 0.3 volts to minus 1.7 volts is applied to an input line 32, the voltage swing is shifted down by the voltage drop across four diodes and shifted up the voltage drop across the diode 21 to produce a net voltage drop of 2.1 volts which produces a voltage swing at input node 35 of minus 2.4 volts to minus 3.8 volts. When this voltage swing is applied to output line 37, an amplified voltage swing will appear at the source of transistor Q9' turning on and off source follower transistor Q12 in output stage 38. Similarly, when the ECL voltage signal swings of minus 0.8 volts to minus 1.6 volts are applied to the input lines 32, there is produced a voltage swing of minus 2.9 volts to minus 3.7 volts at input node 35 on line 37. When either of the afore-mentioned voltage swings are applied to input node 35 at line 37 there will be produced an amplified voltage swing at the gate of transistor Q12. The voltage swing on line 39 to the input of the gate of transistor Q12 is from a high of zero volts to a low of minus 2.7 volts or less when either of the afore-mentioned ECL or GaAs voltage swings are applied to the inputs sufficient to cause switching of the differential amplifier 41. When the voltage swing of zero volts to minus 2.7 volts is applied to the gate of transistor Q12, it causes the source follower transistor Q12 to switch between the levels of minus 0.1 volts and minus 0.9 volts or less. This latter voltage swing is down shifted across diode 42 to produce an output voltage swing of minus 0.8 volts to minus 1.6 volts or less on output line 43 which is capable of driving ECL loads. The external load matching resistor 44 is shown as 50 ohms which is typical of the characteristic impedance of coaxial cable. It will be understood that this matching load resistor is external to the GaAs circuit and is not manufactured and made on the integrated circuit chip.

Referring now to FIGS. 5 and 6, it will be understood that the OR gate logic 31 is connected to the level shifting network 34 which includes an AND gate 45 comprising diodes 21, the afore-mentioned pull-up transistors Q1' and the pull-down transistors Q2' and Q3'. The differential amplifier 41 is shown having input transistor Q8' and output transistor Q10' in association with the afore-mentioned current source load transistor Q9' and the pull-down current source transistor Q11' similar to those in FIG. 4. Diode 40 assures that a logic low on line 39 causes Q12 to turn OFF.

Having explained the voltage swings and operation of the electrical circuit shown in FIG. 5, it will be understood that typical GaAs voltage swings in association with typical emitter coupled logic voltage swings may be completely mixed and produce output signals at output line 43 which are capable of driving ECL logic circuits.

Figure 7:
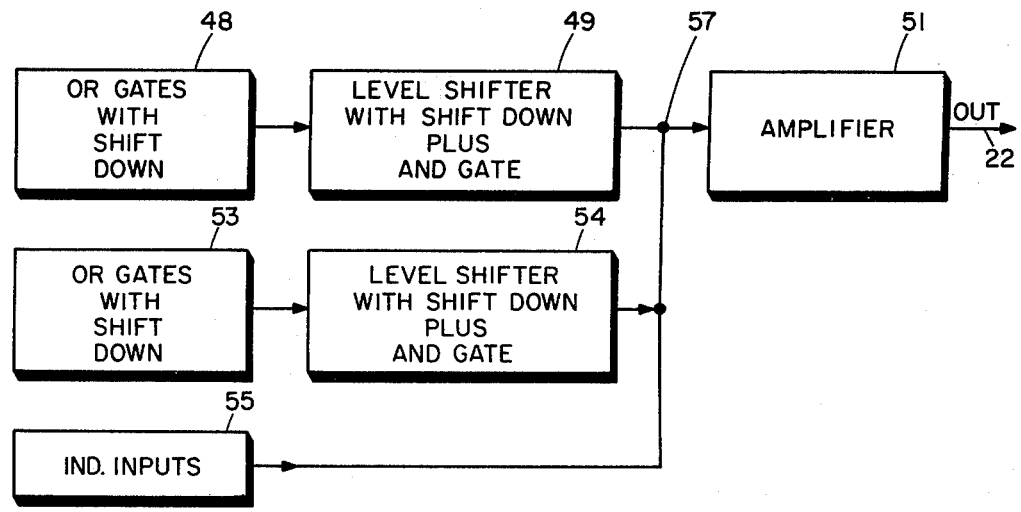
FIG. 7 is a block diagram of yet another modification of the circuit of FIG. 1.

Refer now to FIG. 7 which is a block diagram which may be employed to explain the operation of FIG. 1 in association with the amplifiers of FIGS. 3 and 4 or the operation of FIG. 5. Block 48 is representative of the OR gates shown in FIGS. 1 and 5 which perform an OR gate logic function and cause a voltage shift down. Block 49 is representative of the level shifters in FIGS. 1 and 5 which are accompanied by a voltage shift down and also by a voltage shift up which occurs at the AND gate. Block 51 is representative of the different form of amplifiers discussed hereinbefore. When the amplifier of FIG. 3 is used as an amplifier, the OR gate inputs are restricted to GaAs inputs and produce only voltage swing outputs capable of driving GaAs logic. When the amplifier of FIG. 4 is employed at block 51 in conjunction with the electrical circuit of FIG. 1, either GaAs or ECL input logic voltage swings may be applied to the inputs of the OR gates to produce output signals at the amplifier 51 capable of driving GaAs logic.

The modified circuit shown in FIG. 5 is similar in some respects to the combination of FIG. 1 and FIG. 4 in that either GaAs or ECL input voltage swings may be applied to the circuit. However, the amplifier of the FIG. 5 embodiment incorporates not only a differential amplifier 41 but requires a source follower output stage 38 having a load impedance 44 which matches the characteristic line impedance of the connections to the ECL logic being driven.

A further modification of the novel OR-AND logic may be implemented on the same integrated circuit chip. For example, shown in FIG. 7 at block 53 is a second set of OR gates which are identical to the OR gates shown in block 48. Similarly, in block 54 there is shown a second plurality of level shifting networks identical to the level shifting networks in block 49. It will be understood that the duplication of the OR gates and level shifting networks makes the logic wider or capable of having more inputs. Also shown on FIG. 7 are independent inputs 55. Such inputs may have a GaAs or ECL logic level which can be either internal or external to the integrated circuit chip. The output of level shifters 49, 54 and inputs 55 are shown mutually connected in an OR gate configuration before being applied to amplifier 51 to produce an amplified output on line 22.

Figure 8:
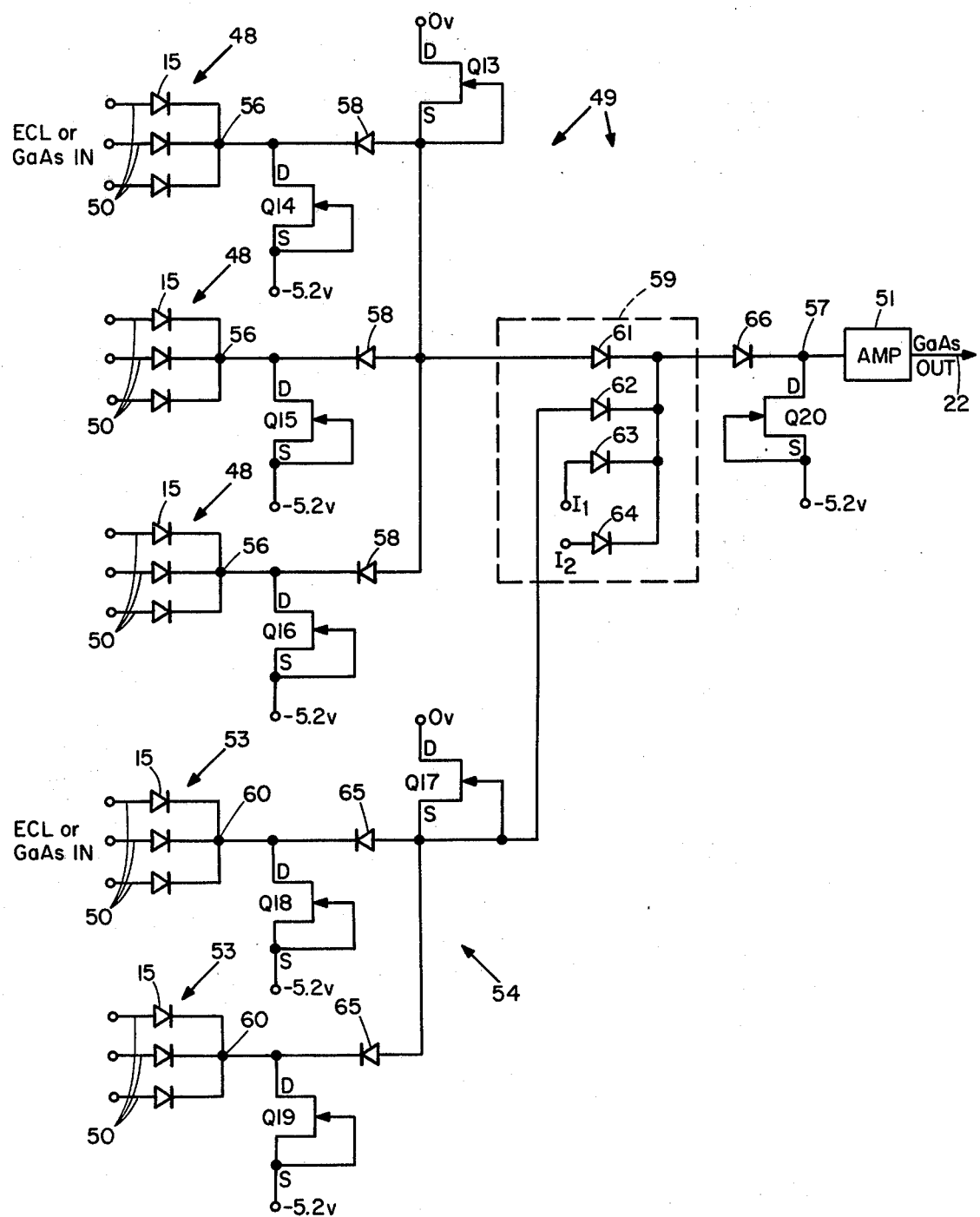
FIG. 8 is a schematic diagram of an electrical circuit showing a preferred embodiment implementation of the block diagram of FIG. 7.

Refer now to FIG. 8 which is a schematic diagram of an electrical circuit showing a preferred embodiment implementation of the complete block diagram of FIG. 7. The OR logic function is performed by OR gates 48 having their cathodes mutually connected at output node 56. The circuitry between output node 56 and amplifier input node 57 comprises the level shifting network 49. It will be understood that part of the level shifting network comprises an AND gate function which is performed by diodes 58 which have their anodes connected to the source of transistor Q13. In the modified embodiment of FIG. 8 an additional OR gate function is performed by the diodes 61 through 64 shown inside of the phantom line block 59. It will be understood that diodes 61 and 62 also are included as part of the level shifting networks of level shifting networks 49 and 54. The output of the second set of OR gates 53 each have an output node 60. The second plurality of level shifting networks 54 include the circuitry shown between output nodes 60 and amplifier input node 57. It will be understood that this second set of level shifting networks 54 also include diodes 65 which perform AND gate logic functions and further include diode 62 which performs an OR gate function. When an ECL or GaAs voltage level swing is applied to the input OR gates 48, 53 in the right combination, it will produce an output voltage swing at the amplifier input node 57 which is identical to that described hereinbefore with regards to FIG. 1. Thus, the amplifier 51 may be identical with the amplifier 13 described hereinbefore which is preferably an amplifier as shown in FIG. 3 or FIG. 4. The afore-mentioned independent inputs 55 are shown as I1 and I2 which comprise two inputs to the OR gate 59. If the amplifier 51 is an inverting amplifier, as has been explained with regards to FIG. 3, then the logic becomes OR-AND-NOR and if the amplifier 51 does not invert the logic becomes OR-AND-OR.

Having explained how the number of OR gates may be increased to produce a wider input to the basic logic shown in FIG. 8, it will be appreciated that a very large number of sets of OR gates may be added to the logic circuitry shown in FIG. 8 without appreciably degrading the speed of the novel basic logic circuit.

Having explained how additional sets of OR gates may be employed with the logic circuitry of FIG. 8, it will now be appreciated that a plurality of sets of OR gates similar to OR gates 11 shown in FIG. 1 and OR gates 31 shown in FIG. 5 may be employed to provide a very wide input to the logic circuitry of FIGS. 1 and 5. It will be appreciated that the addition of sets of OR and AND gates in the level shifting networks have very little effect on speed and has a positive effect on speed power product. This is to say that numerous additional logic functions may be performed without the requirement of individual amplification of the input stages. Further, it will be appreciated that numerous logic stages may be added without the requirement of individual amplification stages thus the amount of real estate or area required on the chip to perform a large number of logic functions is reduced substantially. It will be also appreciated that the logic functions being performed are being performed by an absolute minimum number of diodes and that diode logic circuitry when implemented in GaAs form requires the minimum of real estate or area for implementation. Coupling these two synergistic enhancements together there is produced a new and novel high density logic family which permits the construction of extremely complex combinational gates.

The level shifting networks of the novel high density basic logic circuit include mutual use of some elements. For example, in FIG. 8 starting at node 56, the voltage swing signal is transmitted through diode 58 which performs both shifting up and the AND logic function and then is shifted down in diode 61 which also performs an OR logic function and is further shifted down in diode 66 to produce the proper level shift of voltage at amplifier input node 57. Pull-up transistor Q13 behaves similar to a pull-up resistor and is not in a switching mode. The pull-down current source transistors Q14, Q15 and Q16 are not switched. Thus, there is no speed loss in transistors Q13–Q16. Similarly, pull-up transistor Q17 and pull-down current source transistors Q18 and Q19 are not switched transistors and are not performing switching functions. Since the diode arrangement in FIG. 8 is slightly modified from the diode arrangement in FIG. 1 an additional pull-down transistor Q20 is provided to assure that the diodes 61–64 and 66 may be forward biased with respect to the source of pull-up transistor Q13.

Figure 9:
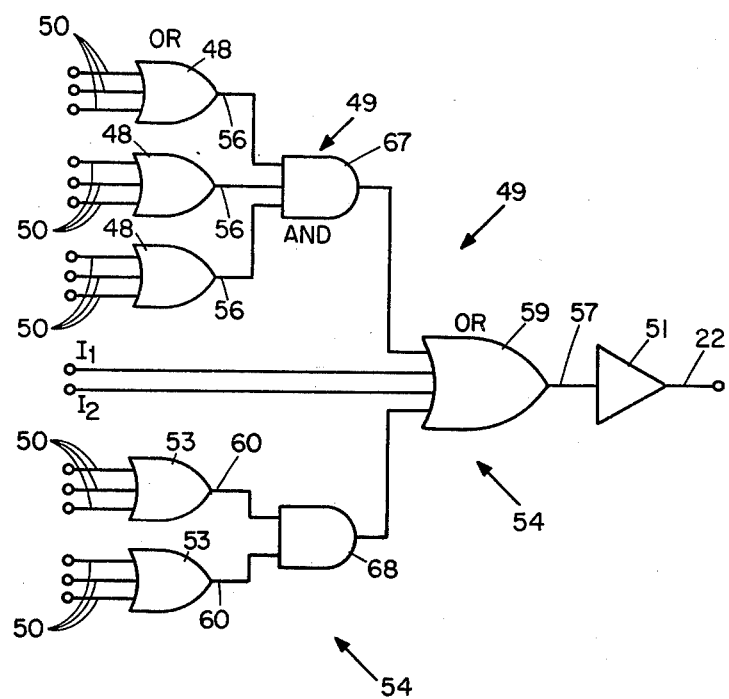
FIG. 9 is a logic diagram of the electrical circuit of FIG. 8.

Refer now to FIG. 9 which is a logic diagram of the complex combinational gating circuitry of FIG. 8. Input lines 50 are applied to the sets of OR gates 48 and the output from OR gates 48 is applied to the level shifting network 49 which is intermediate the nodes 56 and 57. The level shifting network 49 also includes AND gate 67 and OR gate 59. Independent input lines I1 and I2 may be applied directly to OR gate 59. Input lines 50 to the sets of OR gates 53 produce signals at their output nodes 60. The level shifting networks 54 intermediate nodes 60 and 57 include AND gate 68 and OR gate 59.

Having explained the logic function of the basic logic circuit of FIG. 8 with the logic diagram of FIG. 9 it will be understood that many of the components of the combinational gating basic logic circuit perform more than one function. Having explained a preferred embodiment basic logic circuit and modifications thereof, it will be appreciated that the basic logic circuitry described herein permits the building of a microprocessor which is smaller, faster and requires less energy than commercially available microprocessors implemented in silicon-employing ECL logic. Further, the novel high speed basic logic circuit of the present invention is implemented in a GaAs logic form which is faster and more energy efficient than prior art GaAs logic circuits.

As a typical example of the speed power product improvement to be expected from the present invention, a typical silicon ECL large scale integrated circuit was examined for speed and power. When the same lithography is employed for comparison, that is the emitter stripe width for the ECL circuit, and the channel length for the gallium arsenide MESFET circuit, a realistic comparison can be made. In the present example, the average speed power product of the ECL circuit is enhanced by a factor of at least four to one when implemented in gallium arsenide.

When the number of input logic OR gates is increased beyond the average, as was done in the combinational gating arrangement of the present GaAs invention, there is a greater enhancement in speed power product over conventional prior art depletion mode GaAs logic gating circuits.

We claim:

1. A high speed gallium arsenide basic logic circuit for processing either emitter coupled logic (ECL) or gallium arsenide (GaAs) signals comprising:
   a plurality of OR gates each having a plurality of individual input lines with at least one forward biased diode connected in series with each input line,
   each said OR gate having an output node connected to said input lines at the cathode side of said diodes,
   said OR gates providing a voltage shift down across said diodes of said input lines,
   a plurality of level shifting networks, each being connected in series with one of said OR gates,
   each said level shifting network comprising at least three diodes of which at least two of said diodes are forward biased to provide a further voltage shift down,
   said plurality of level shifting networks comprising a diode AND gate,
   each said level shifting network having at least one diode which is connected in series to cause a level shift up,
   each diode of said AND gate being forward biased by a pull-up transistor connected to the anode side and a pull-down transistor connected to the cathode side, and
   an amplifier stage connected to the output of said level shifting network, whereby voltage signal levels applied to the input of said OR gates are processed through logic decisions while being shifted down and shifted up before being amplified, thus, providing enhanced speed power products in simplified GaAs logic circuitry.

2. A high speed GaAs basic logic circuit as set forth in claim 1, wherein said amplifier comprises a GaAs common source transistor amplifier for producing output signals capable of driving GaAs logic from GaAs logic signals applied to said input lines.

3. A high speed GaAs basic logic circuit as set forth in claim 2, wherein said common source transistor amplifier comprises a GaAs pull-up transistor and a GaAs pull-down transistor connected in series.

4. A high speed GaAs basic logic circuit as set forth in claim 1, wherein said amplifier comprises a GaAs differential amplifier of the type having an input branch and an output branch, and
   an output line connected to one of said branches for producing output signals capable of driving GaAs logic from either GaAs or ECL logic voltage level signals at said input lines.

5. A high speed GaAs basic logic circuit as set forth in claim 1, wherein said amplifier comprises a GaAs differential amplifier of the type having an input branch and an output branch, and
   a GaAs source follower transistor output stage connected to said output branch of said differential amplifier for producing output signals capable of driving ECL logic from either GaAs or ECL logic voltage level signals at said input lines.

6. A high speed GaAs basic logic circuit as set forth in claim 1, wherein said level shifting networks each include at least four GaAs diodes of which three of said diodes shift the voltage level at said input lines down and at least one of said diodes shifts the voltage level up.

7. A high speed GaAs basic logic circuit as set forth in claim 6, wherein said GaAs diode which shifts the input line voltage level up also performs an AND gate logic function.

8. A high speed GaAs basic logic circuit as set forth in claim 1, which further includes a second set of OR gates connected to a second plurality of level shifting networks which form a second AND gate,
   the outputs of said level shifting networks being connected to an output OR gate intermediate said level shifting networks and said amplifier.

9. A high speed GaAs basic logic circuit as set forth in claim 8, which further includes individual input signal lines, and
   said output OR gate being characterized by receiving the outputs of said AND gates as well as the individual input signal lines.

10. A high speed GaAs basic logic circuit as set forth in claim 9, wherein said amplifier is a differential amplifier for producing output signals capable of driving GaAs logic from either GaAs or ECL voltage signals at said input lines.

* * * * *